United States Patent
Tanaka

(10) Patent No.: US 11,587,855 B2
(45) Date of Patent: Feb. 21, 2023

(54) METHOD OF ATTACHING AN INSULATION SHEET TO ENCAPSULATED SEMICONDUCTOR DEVICE

(71) Applicant: FUJI ELECTRIC CO., LTD., Kawasaki (JP)

(72) Inventor: Masanori Tanaka, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/158,388

(22) Filed: Jan. 26, 2021

(65) Prior Publication Data

US 2021/0287968 A1 Sep. 16, 2021

(30) Foreign Application Priority Data

Mar. 12, 2020 (JP) .............................. JP2020-042605

(51) Int. Cl.
*H01L 23/495* (2006.01)
*H01L 23/29* (2006.01)
(Continued)

(52) U.S. Cl.
CPC ........ *H01L 23/49503* (2013.01); *H01L 21/56* (2013.01); *H01L 23/295* (2013.01);
(Continued)

(58) Field of Classification Search
CPC ........... H01L 23/49541; H01L 23/3737; H01L 23/49503; H01L 23/295; H01L 23/3107; H01L 23/49575; H01L 23/4951; H01L 24/49; H01L 24/06; H01L 21/56; H01L 2924/181; H01L 2924/0665; H01L 25/072; H01L 24/85
See application file for complete search history.

(56) References Cited

U.S. PATENT DOCUMENTS 6,291,880 B1 * 9/2001 Ogawa ................ H01L 23/4334
257/725
10,043,762 B2 * 8/2018 Tadakuma ........ H01L 23/49513
(Continued)

FOREIGN PATENT DOCUMENTS

JP 2003-007966 A 1/2003
JP 2003-124400 A 4/2003
(Continued)

*Primary Examiner* — Alonzo Chambliss
(74) *Attorney, Agent, or Firm* — Rabin & Berdo, P.C.

(57) ABSTRACT

A method of manufacturing a semiconductor device, including: preparing a power semiconductor chip, a lead frame having a die pad part and a terminal part integrally connected to the die pad part, and an insulating sheet in a semi-cured state; disposing the power semiconductor chip on a front surface of the die pad part and performing wiring; encapsulating the lead frame and the power semiconductor chip with an encapsulation raw material in a semi-cured state, to thereby form a semi-cured unit, the terminal part projecting from the semi-cured unit, and a rear surface of the die pad part being exposed from a rear surface of the semi-cured unit; pressure-bonding a front surface of the insulating sheet to the rear surface of the semi-cured unit to cover the rear surface of the die pad part; and curing the semi-cured unit and the insulating sheet by heating.

14 Claims, 14 Drawing Sheets

(51) Int. Cl.
  *H01L 21/56* (2006.01)
  *H01L 23/31* (2006.01)
  *H01L 23/373* (2006.01)
  *H01L 23/00* (2006.01)
  *H01L 25/07* (2006.01)

(52) U.S. Cl.
  CPC ...... *H01L 23/3107* (2013.01); *H01L 23/3737* (2013.01); *H01L 23/49541* (2013.01); *H01L 24/06* (2013.01); *H01L 24/49* (2013.01); *H01L 24/85* (2013.01); *H01L 25/072* (2013.01); *H01L 2924/0665* (2013.01); *H01L 2924/181* (2013.01)

(56) References Cited

U.S. PATENT DOCUMENTS

| | | | |
|---|---|---|---|
| 2002/0190374 A1 | 12/2002 | Nakajima et al. | |
| 2004/0075169 A1* | 4/2004 | Yamada | H01L 23/3107 257/E23.044 |
| 2004/0089928 A1* | 5/2004 | Nakajima | H01L 23/4334 257/E23.044 |
| 2005/0082690 A1 | 4/2005 | Hayashi et al. | |
| 2006/0267187 A1* | 11/2006 | Liu | H01L 23/49575 257/E23.092 |
| 2009/0243058 A1* | 10/2009 | Shirasaka | H04R 1/04 257/E21.536 |
| 2012/0326289 A1* | 12/2012 | Minamio | H01L 21/565 257/676 |
| 2014/0210093 A1* | 7/2014 | Wang | H01L 21/56 257/773 |
| 2016/0093562 A1* | 3/2016 | Kim | H01L 23/3735 257/676 |
| 2016/0343644 A1* | 11/2016 | Kawashima | H01L 23/4334 |
| 2018/0096910 A1 | 4/2018 | Ishii | |

FOREIGN PATENT DOCUMENTS

| | | |
|---|---|---|
| JP | 2004-140305 A | 5/2004 |
| JP | 2005-123495 A | 5/2005 |
| JP | 2018-060902 A | 4/2018 |

* cited by examiner

US 11,587,855 B2

METHOD OF ATTACHING AN INSULATION SHEET TO ENCAPSULATED SEMICONDUCTOR DEVICE

CROSS-REFERENCE TO RELATED APPLICATIONS

This application is based upon and claims the benefit of priority of the prior Japanese Patent Application No. 2020-042605, filed on Mar. 12, 2020, the entire contents of which are incorporated herein by reference.

BACKGROUND OF THE INVENTION

1. Field of the Invention

The embodiments discussed herein relate to a semiconductor device manufacturing method and a semiconductor device.

2. Background of the Related Art

A semiconductor device includes power semiconductor chips and control integrated circuits (ICs), die pads on which the semiconductor chips and control ICs are disposed, and an insulating sheet provided on the rear surfaces of the die pads, and is encapsulated with an encapsulation member. Power device switching elements are used as the power semiconductor chips. Examples of the switching elements include insulated gate bipolar transistors (IGBTs) and power metal oxide semiconductor field effect transistors (MOS-FETs). The control ICs control the driving of the power semiconductor chips. In this semiconductor device, heat generated by the power semiconductor chips and control ICs is radiated from the insulating sheet via the die pads.

Such a semiconductor device is manufactured by the following steps. First, power semiconductor chips and electronic parts are disposed on die pads, and the die pads are disposed on an insulating sheet previously placed in a mold. While the die pads are pressed against the insulating sheet with pressing pins, an encapsulation resin is inserted into the mold. Then the pressing pins are pulled out and the encapsulation resin is cured within the mold. Then, by removing the mold, a semiconductor device is obtained (for example, Japanese Laid-open Patent Publication No. 2005-123495).

In the above-described semiconductor device manufacturing method, however, since the die pads are pressed against the insulating sheet with the pressing pins, corrugation is more likely to occur between the die pads and the insulating sheet at areas farther from the pressing pins. If the semiconductor device in this condition is encapsulated, its heat dissipation property may deteriorate, which reduces its reliability. Further, the shape, size, and others of the insulating sheet need to be changed according to the specifications of the mold into which the insulating sheet is placed. Therefore, the specifications of the insulating sheet need to be revised for each mold. Still further, a conveyance mechanism for placing the insulating sheet in the mold is complex and expensive. For these reasons, the manufacturing cost for semiconductor devices is increased.

SUMMARY OF THE INVENTION

According to one aspect, there is provided a method of manufacturing a semiconductor device. The method includes a preparation step of preparing a power semiconductor chip, a lead frame, and an insulating sheet in a semi-cured state, the lead frame having a die pad part and a terminal part integrally connected to the die pad part; a mounting step of disposing the power semiconductor chip on a front surface of the die pad part and performing wiring; an encapsulation step of encapsulating the lead frame and the power semiconductor chip with an encapsulation raw material in a semi-cured state, to thereby form a semi-cured unit, the terminal part projecting from the semi-cured unit, and a rear surface of the die pad part being exposed from a rear surface of the semi-cured unit; a pressure-bonding step of pressure-bonding a front surface of the insulating sheet to the rear surface of the semi-cured unit to cover the rear surface of the die pad part; and a curing step of curing the semi-cured unit and the insulating sheet by heating.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described with reference to the accompanying drawings. In the following description, the terms "front surface" and "upper surface" represent surfaces facing up in the semiconductor device 10 of FIGS. 1 and 3. Similarly, the term "up" represents an upward direction in the semiconductor device 10 of FIGS. 1 and 3. The terms "rear surface" and "lower surface" represent surfaces facing down in the semiconductor device 10 of FIGS. 1 and 3. The term "down" represents a downward direction in the semiconductor device 10 of FIGS. 1 and 3. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" do not always represent the vertical direction to the ground. That is, the "up" and "down" directions are not limited to the gravity direction. In addition, in the following description, a component contained by 80 vol % or more is called a "principal component."

First Embodiment

Figure 1A:
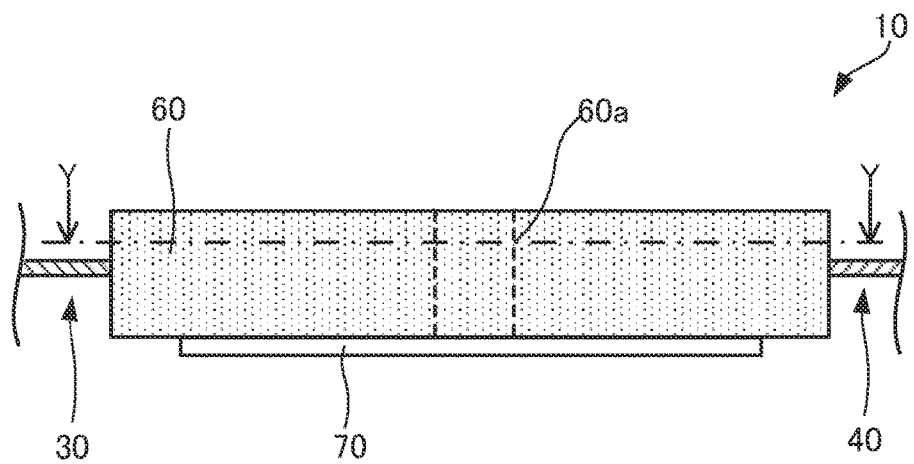
FIGS. 1A and 1B illustrate the outline of a semiconductor device according to a first embodiment.
Figure 1B:
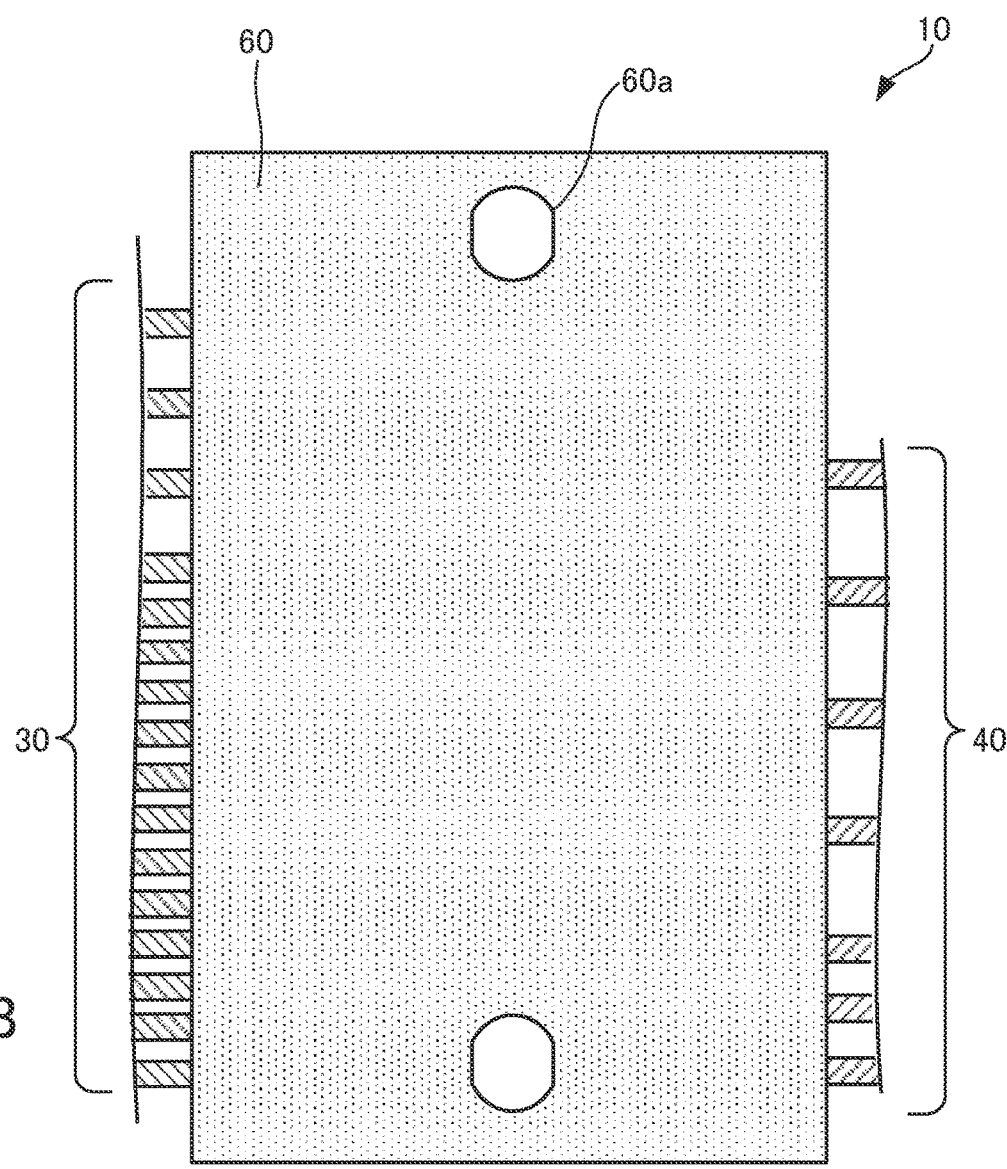
Figure 2:
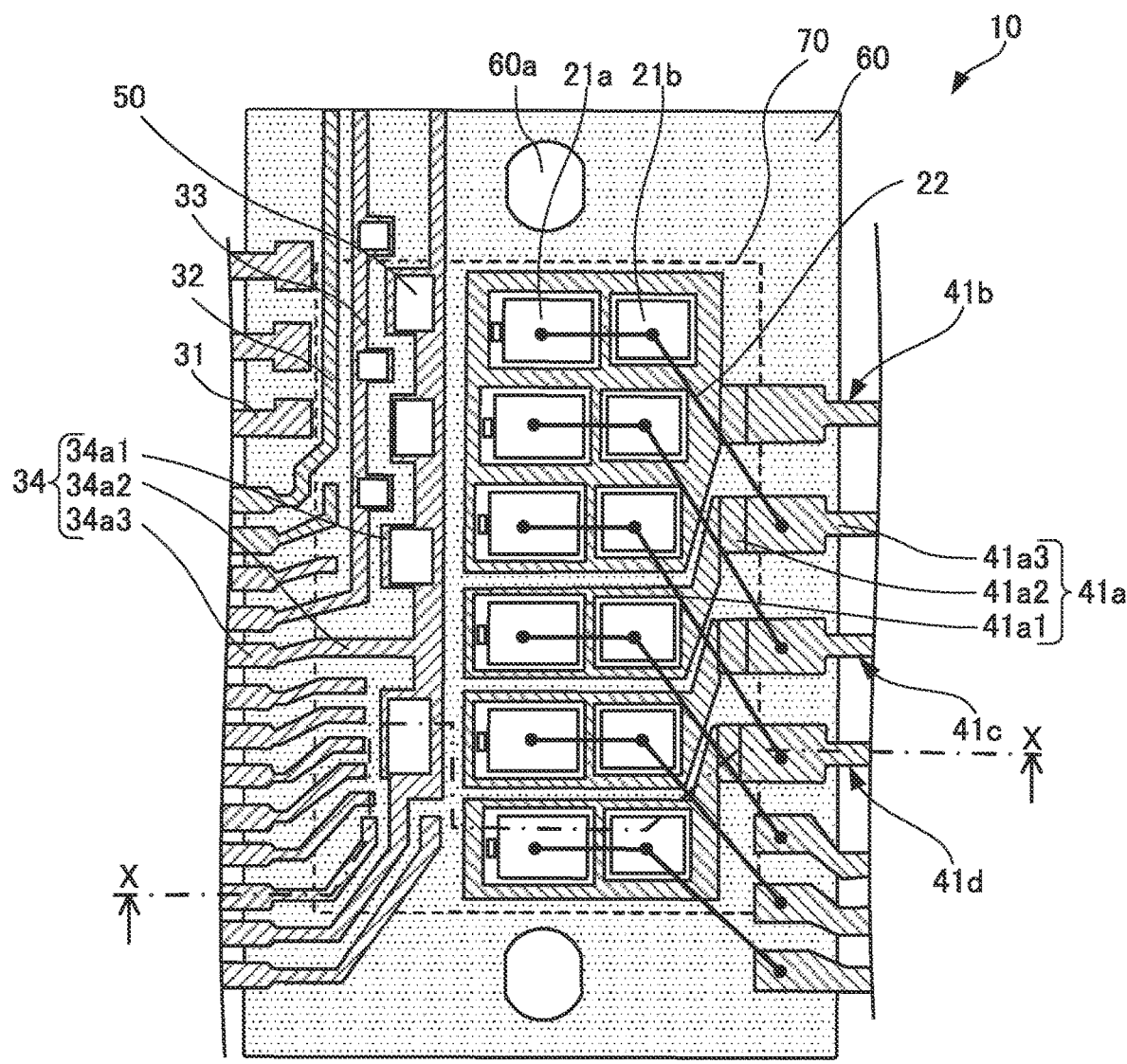
FIG. 2 is a horizontal sectional view of the semiconductor device according to the first embodiment.
Figure 3:
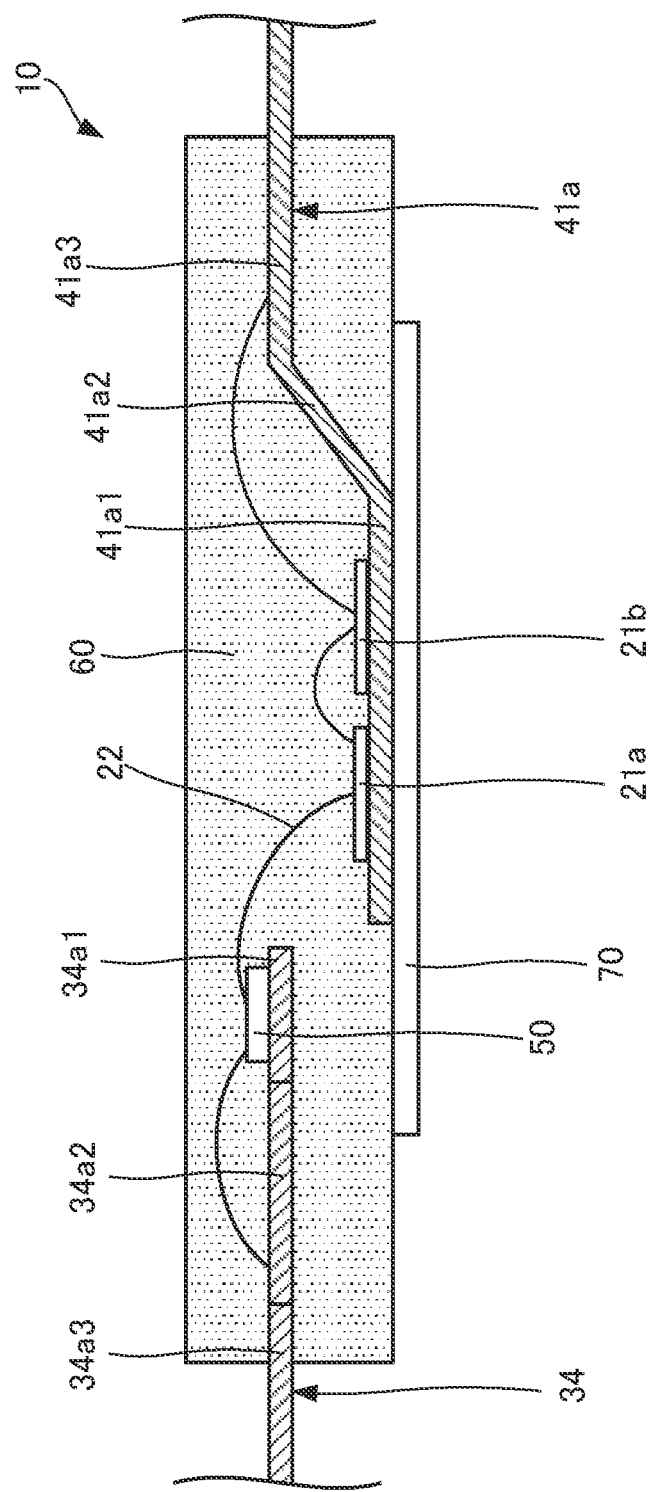
FIG. 3 is a vertical sectional view of the semiconductor device according to the first embodiment.

A semiconductor device 10 according to a first embodiment will be described with reference to FIGS. 1 to 3. FIGS. 1A and 1B illustrate the outline of the semiconductor device according to the first embodiment. In this connection, FIG. 1A is a side view of the semiconductor device 10 (as seen from above or bottom in FIG. 1B), and FIG. 1B is a plan view of the semiconductor device 10. FIG. 2 is a horizontal sectional view of the semiconductor device according to the first embodiment, and FIG. 3 is a vertical sectional view of the semiconductor device according to the first embodiment. In this connection, the sectional view of FIG. 2 is a view along the dot-dashed line Y-Y of FIG. 1A. The sectional view of FIG. 3 is a view along the dot-dashed line X-X of FIG. 2.

As illustrated in FIGS. 1A and 1B, the semiconductor device 10 is entirely encapsulated with an encapsulation member 60 and has a three-dimensional shape. In this connection, the encapsulation member of the semiconductor device 10 may have a three-dimensional shape with curved corners. The front surface of the semiconductor device 10 is covered with the encapsulation member 60 and the rear surface thereof is covered with the encapsulation member 60 and an insulating sheet 70. In this connection, the position of the insulating sheet 70 on the rear surface of the encapsulation member 60 is indicated by the broken line in FIG. 2. In addition, a plurality of control lead frames 30 and a plurality of main current lead frames 40 extend from both side surfaces of the long side of the encapsulation member 60, respectively. In this embodiment, the control lead frames and the main current lead frames are, unless otherwise distinguished, referred to as the control lead frames 30 and the main current lead frames 40, respectively. In addition, in the semiconductor device 10, mounting holes 60a are respectively formed in both end portions in the long direction of the encapsulation member 60. The mounting holes 60a are respectively arranged at two positions in both end portions on a center line that is parallel to the long direction of the encapsulation member 60 and passes through the center of the encapsulation member 60. Each mounting hole 60a has such a diameter as to allow a bolt to pass therethrough, as will be described later. The mounting holes 60a penetrate between the front and rear surfaces of the encapsulation member 60. The mounting holes 60a are formed outside the insulating sheet 70 in plan view. By inserting bolts in the mounting holes 60a, the semiconductor device 10 is attached to a cooling unit such as a heatsink.

In the above semiconductor device 10, the parts illustrated in FIGS. 2 and 3 are encapsulated with the encapsulation member 60. More specifically, the semiconductor device 10 includes six sets each of a first semiconductor chip 21a and second semiconductor chip 21b, the control lead frames 30 (including control lead frames 31 to 34), main current lead frames 40 (including main current lead frames 41a to 41d), and control ICs 50. In addition, in the semiconductor device 10, the control lead frames 30, control ICs 50, first semiconductor chips 21a, second semiconductor chips 21b, main current lead frames 40 are electrically connected by bonding wires 22 as appropriate. In this connection, the bonding wires 22 connecting to the control ICs 50 are not illustrated in FIG. 2. These parts of the semiconductor device 10 are encapsulated with the encapsulation member 60. Note that the rear surfaces of die pad parts (die pad part 41a1 in FIG. 2), to be described later, of the main current lead frames 40 are exposed on the encapsulation member 60 and is flush with the rear surface of the encapsulation member 60. In the semiconductor device 10, the insulating sheet 70 is attached to cover the die pad parts exposed on the rear surface of the encapsulation member 60.

The first and second semiconductor chips 21a and 21b are power semiconductor chips made of silicon, silicon carbide, or gallium nitride. The first semiconductor chips 21a include switching elements. The switching elements are power MOSFETs, IGBTs, or others. For example, such first semiconductor chips 21a each have a drain electrode (positive electrode, or a collector electrode in an IGBT) serving as a main electrode on its rear surface, and also have a gate electrode (control electrode) serving as a control electrode and a source electrode (negative electrode, or an emitter electrode in the IGBT) serving as a main electrode on its front surface. In addition, the second semiconductor chips 21b include diode elements. The diode elements are freewheeling diodes (FWDs) such as Schottky barrier diodes (SBDs) and P-intrinsic-N (PiN) diodes. Such second semiconductor chips 21b each have a cathode electrode serving as a main electrode on its rear surface and also have an anode electrode serving as a main electrode on its front surface. The first and second semiconductor chips 21a and 21b have a thickness in a range from 180 μm to 220 μm, inclusive, and is averaged at approximately 200 μm. In addition, FIG. 2 only illustrates six sets of first and second semiconductor chips 21a and 21b. Not only six sets but also any number of sets may be provided according to the specifications and others of the semiconductor device 10. In addition, semiconductor chips including reverse-conducting (RC)-IGBT switching elements that each integrate an IGBT and an FWD in one chip may be disposed, in place of the first and second semiconductor chips 21a and 21b.

The first and second semiconductor chips 21a and 21b have their rear surfaces joined to prescribed main current lead frames 40 with solder (not illustrated). In this connection, the solder is a lead-free solder containing a prescribed alloy as a principal component. The prescribed alloy is at least any one of a tin-silver alloy, a tin-zinc alloy, and a tin-antimony alloy. The solder may contain an additive such as copper, bismuth, indium, nickel, germanium, cobalt, silicon, or another. In this connection, instead of the solder, the joining may be achieved by sintering using a sintered material. In this case, the sintered material is a powder of silver, gold, or copper, for example.

In each first and second semiconductor chip 21a and 21b, the main electrode formed on its front surface is electrically connected to the terminal part (which will be described later) of the corresponding main current lead frame 40 with a bonding wire 22. In addition, in each first and second semiconductor chip 21a and 21b, the control electrode formed on its front surface is electrically connected to the corresponding control IC 50 with a bonding wire (not illustrated). In this connection, the bonding wires 22 are made of a material with high electrical conductivity. Examples of this material include gold, silver, copper, aluminum, and an alloy containing at least one of these. In addition, the bonding wires 22 have a diameter in a range from 100 μm to 1.0 mm, inclusive, for example.

The plurality of main current lead frames 40 are provided on the right side of the semiconductor device 10 as seen in FIG. 2. One ends of the individual main current lead frames 40 extend from the right side surface of the semiconductor device 10 to the outside as seen in FIG. 2. The main current lead frames 41b, 41a, 41c, and 41d out of the plurality of main current lead frames 40 are encapsulated with the encapsulation member 60 with the rear surface of their die pad parts exposed. In addition, the main current lead frame 41a has a die pad part 41a1, a linking part 41a2, and a terminal part 41a3. The rear surface of the die pad part 41a1 is exposed on the rear surface of the encapsulation member 60 and forms the same plane as the rear surface of the encapsulation member 60. In addition, the rear surface of the die pad part 41a1 may be flush with the rear surface of the encapsulation member 60. In addition, as described earlier, the first and second semiconductor chips 21a and 21b are disposed on the front surface of the die pad part 41a1. The linking part 41a2 is inclined and integrally connects the die pad part 41a1 and the terminal part 41a3. The linking part 41a2 is surrounded and encapsulated by the encapsulation member 60. The terminal part 41a3 is upwardly and horizontally apart from the front surface of the die pad part 41a1 according to the inclination of the linking part 41a2. One end of the terminal part 41a3 is integrally connected to the die pad part 41a1 with the linking part 41a2. To the portion of the terminal part 41a3 surrounded and encapsulated by the encapsulation member 60, the bonding wire 22 connecting to the first and second semiconductor chips 21a and 21b is connected. The other end of the terminal part 41a3 extends from the encapsulation member 60 to the outside. The terminal part 41a3 may extend from the side surface of the encapsulation member 60 in parallel to the front surface of the die pad part 41a1. In this connection, although not illustrated, the main current lead frames 41b, 41c, and 41d also each include a die pad part, a linking part, and a terminal part, as in the main current lead frame 41a.

The plurality of control lead frames 30 (including control lead frames 31, 32, 33, and 34) are provided on the left side of the encapsulation member as seen in FIG. 2. The plurality of control lead frames 30 are positioned at a higher level than the die pad parts of the main current lead frames 40 and at the same level as the terminal parts of the main current lead frames 40. The control lead frames 30 extend from the left side surface of the semiconductor device 10 to the outside as seen in FIG. 2. The control lead frame 34 out of the plurality of control lead frames 30 has a control die pad part 34a1, a control wiring part 34a2, and a control terminal part 34a3. The control die pad part 34a1 extends in the long direction of the semiconductor device 10. Control ICs 50 are disposed on the control die pad part 34a1 with solder (not illustrated). The control wiring part 34a2 integrally connects the control die pad part 34a1 and control terminal part 34a3. The control die pad part 34a1 and control wiring part 34a2 are surrounded and encapsulated by the encapsulation member 60. One end of the control terminal part 34a3 is integrally connected to the control wiring part 34a2 and is surrounded and encapsulated by the encapsulation member 60. A bonding wire (not illustrated) connecting to a control IC 50 or the like is connected to the encapsulated portion of the control wiring part 34a2. The other end of the control terminal part 34a3 extends from the encapsulation member 60 to the outside. The control terminal part 34a3 may extend from the side surface of the encapsulation member 60 in parallel to the front surface of the die pad part 41a1.

The plurality of main current lead frames 40 and the plurality of control lead frames 30 are made of a material with high electrical conductivity. Examples of this material include copper, aluminum, and an alloy containing at least one of these. The plurality of main current lead frames 40 and the plurality of control lead frames 30 have a thickness, preferably, in a range from 0.10 mm and 1.00 mm, inclusive, and more preferably, in a range from 0.20 mm to 0.5 mm, inclusive. In addition, plating using a material with high corrosion resistance may be performed on the plurality of main current lead frames 40 and the plurality of control lead frames 30. Examples of this material include nickel, gold, and an alloy containing at least one of these.

The control ICs 50 are electrically connected to the gate electrodes of the first semiconductor chips 21a with bonding wires (not illustrated). The control ICs 50 apply control voltages to the first semiconductor chips 21a at prescribed timing. In this connection, in the semiconductor device 10, electronic parts such as a thermistor, capacitor, resistance, current sensor, and temperature sensor may be disposed to achieve a desired function, in place of or together with the control ICs 50.

The encapsulation member 60 contains a thermosetting resin and an inorganic filler, which is contained in the thermosetting resin. For example, the thermosetting resin contains at least one selected from the group including epoxy resin, a phenolic resin, and a melamine resin as a principal component. The thermosetting resin preferably contains an epoxy resin as the principal component. In addition, the inorganic filler uses an inorganic substance containing silicon oxide as a principal component. The inorganic filler using silicon oxide functions as a release agent. In addition, such an inorganic filler is able to keep high flame retardance, without a flame retardant such as halogen-based, antimony-based, metal hydroxide-based flame retardant. The inorganic filler is 70 vol % or higher and 90 vol % or less of the entire encapsulation raw material.

Similarly, the insulating sheet 70 contains a thermosetting resin and an inorganic filler, which is contained in the thermosetting resin. For example, the thermosetting resin contains at least one selected from the group including epoxy resin, phenolic resin, melamine resin, and polyimide resin as a principal component. The thermosetting resin preferably contains an epoxy resin as the principal component. In addition, the inorganic filler uses an inorganic substance containing at least one selected from the group including aluminum oxide, aluminum nitride, silicon nitride, and boron nitride, with high insulation property and high electrical conductivity. In addition, preferably, the encapsulation member 60 and the insulating sheet 70 both contain the same thermosetting resin as their principal components. More preferably, the thermosetting resins for the encapsulation member 60 and for the insulating sheet 70 both contain an epoxy resin as their principal components.

The insulating sheet 70 is rectangular in plan view, for example. The insulating sheet 70 has a thickness in a range from 50 μm to 1.0 mm, inclusive. The insulating sheet 70 covers the rear surfaces of the die pad parts of the main current lead frames 40 exposed on the rear surface of the encapsulation member 60. The insulating sheet 70 may cover the rear surfaces of the die pad parts (die pad part 41a1 in FIG. 3) of the main current lead frames 40 and further may cover the rear surface of the encapsulation member 60 around the die pad parts. That is, the rear surface of the insulating sheet 70 forms a level difference from the rear surface of the encapsulation member 60. Covering the rear surfaces of the die pad parts (die pad part 41a1 in FIG. 3) makes it possible to secure the insulating property between the die pad parts and the outside. In addition, covering the rear surface of the encapsulation member 60 around the die pad parts as well makes it possible to secure the insulating property more reliably even if the semiconductor device 10 deforms.

Figure 4:
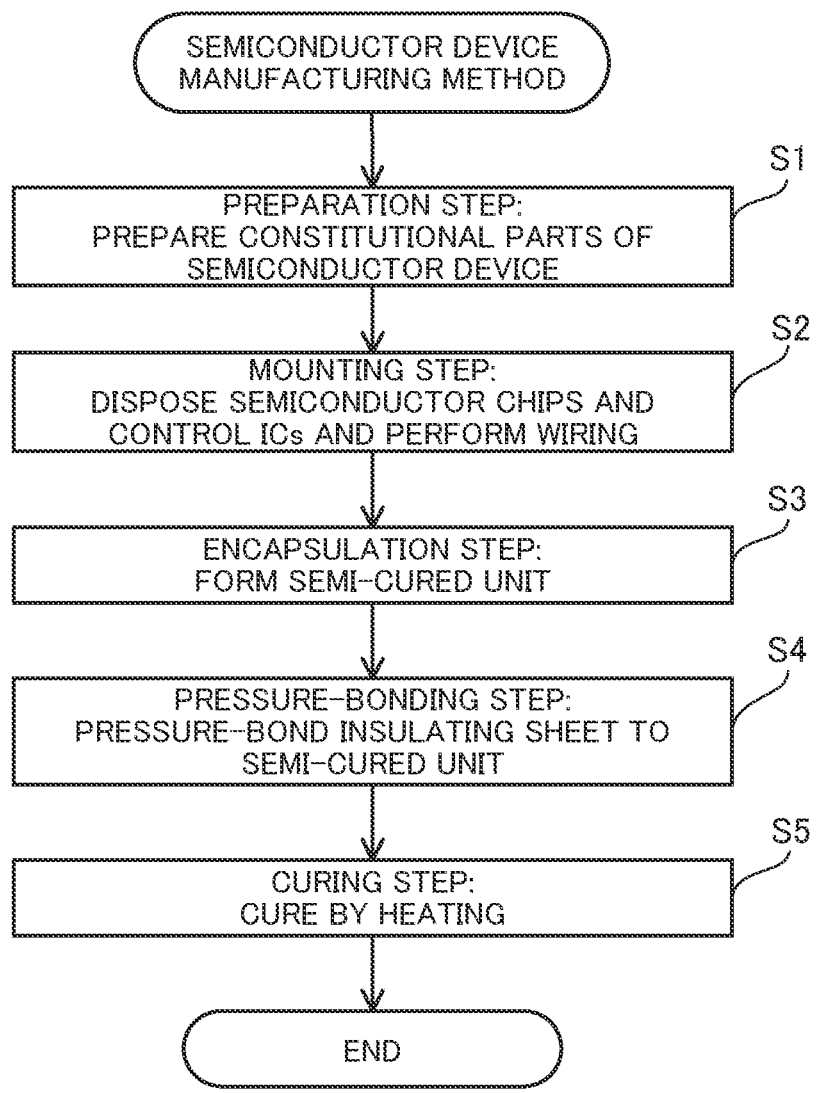
FIG. 4 is a flowchart illustrating a semiconductor device manufacturing method according to the first embodiment.
Figure 5:
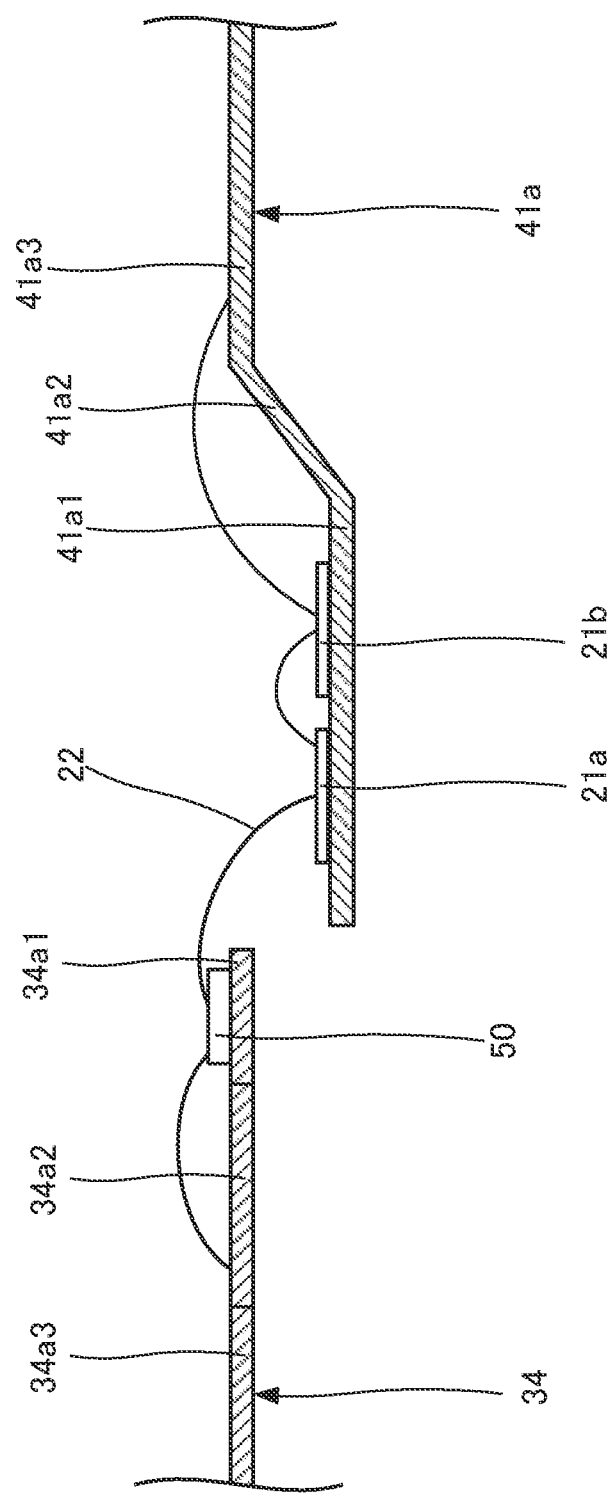
FIG. 5 illustrates a mounting step of disposing semiconductor chips and electronic parts in the semiconductor device manufacturing method according to the first embodiment.
Figure 6:
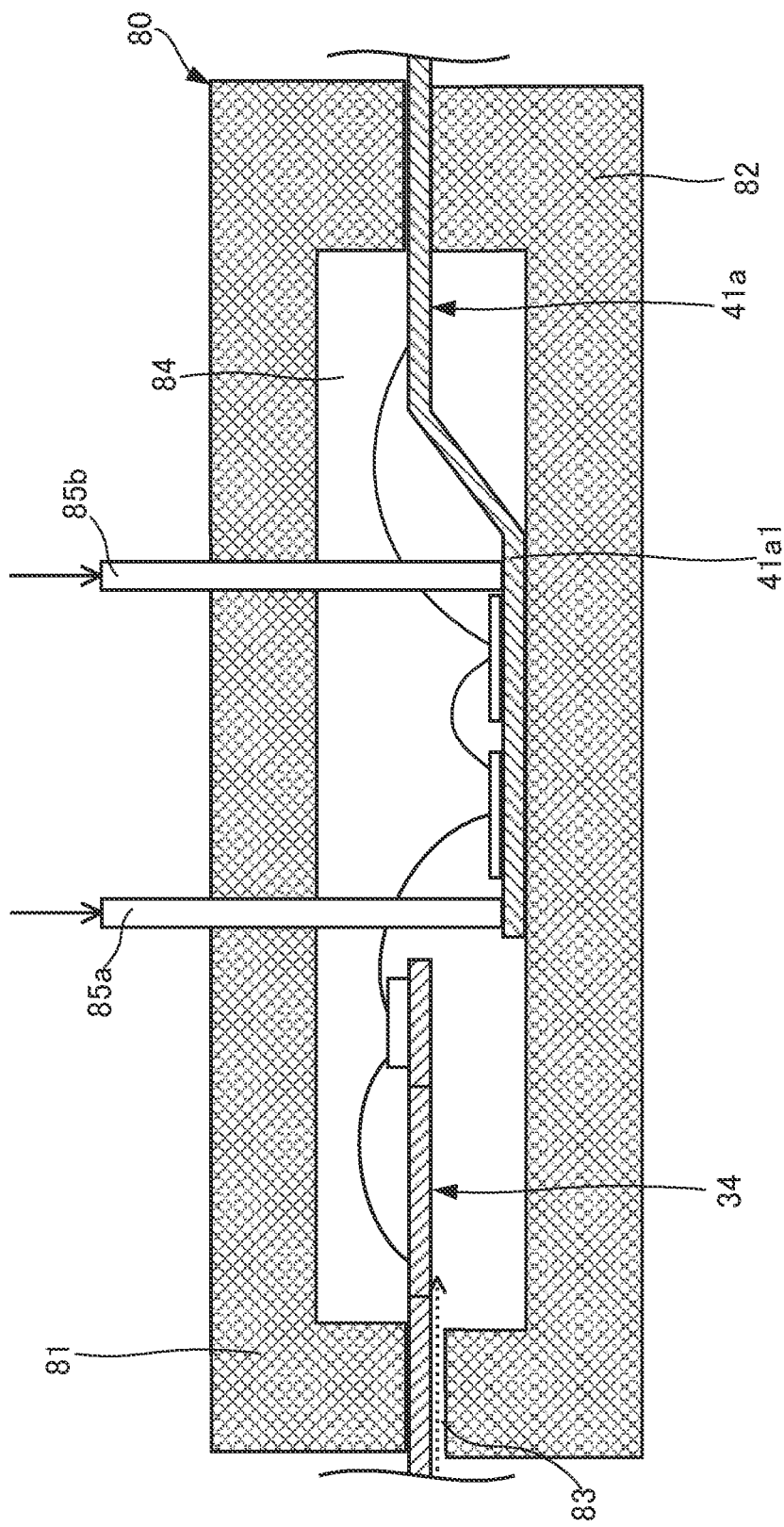
FIG. 6 illustrates an encapsulation step in the semiconductor device manufacturing method according to the first embodiment.
Figure 7:
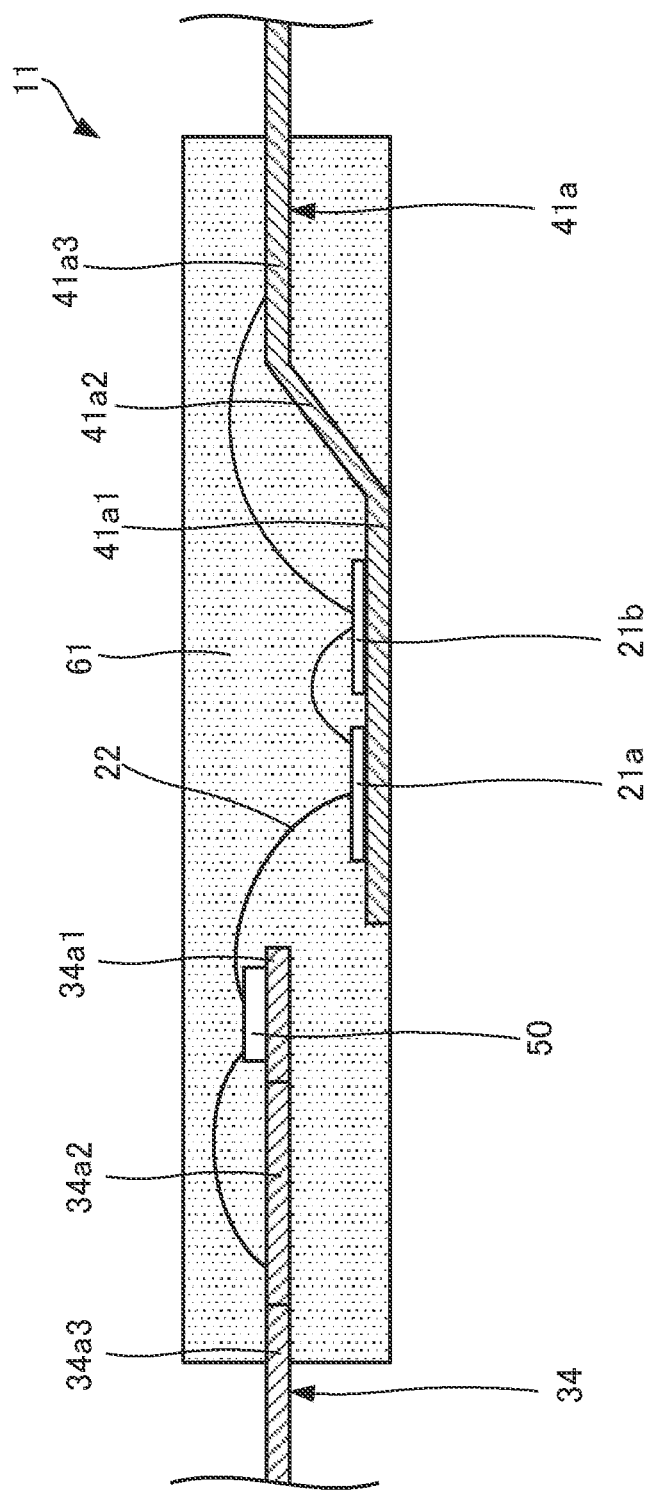
FIG. 7 is a vertical sectional view of a semi-cured unit that is obtained after encapsulating in the semiconductor device manufacturing method according to the first embodiment.
Figure 8:
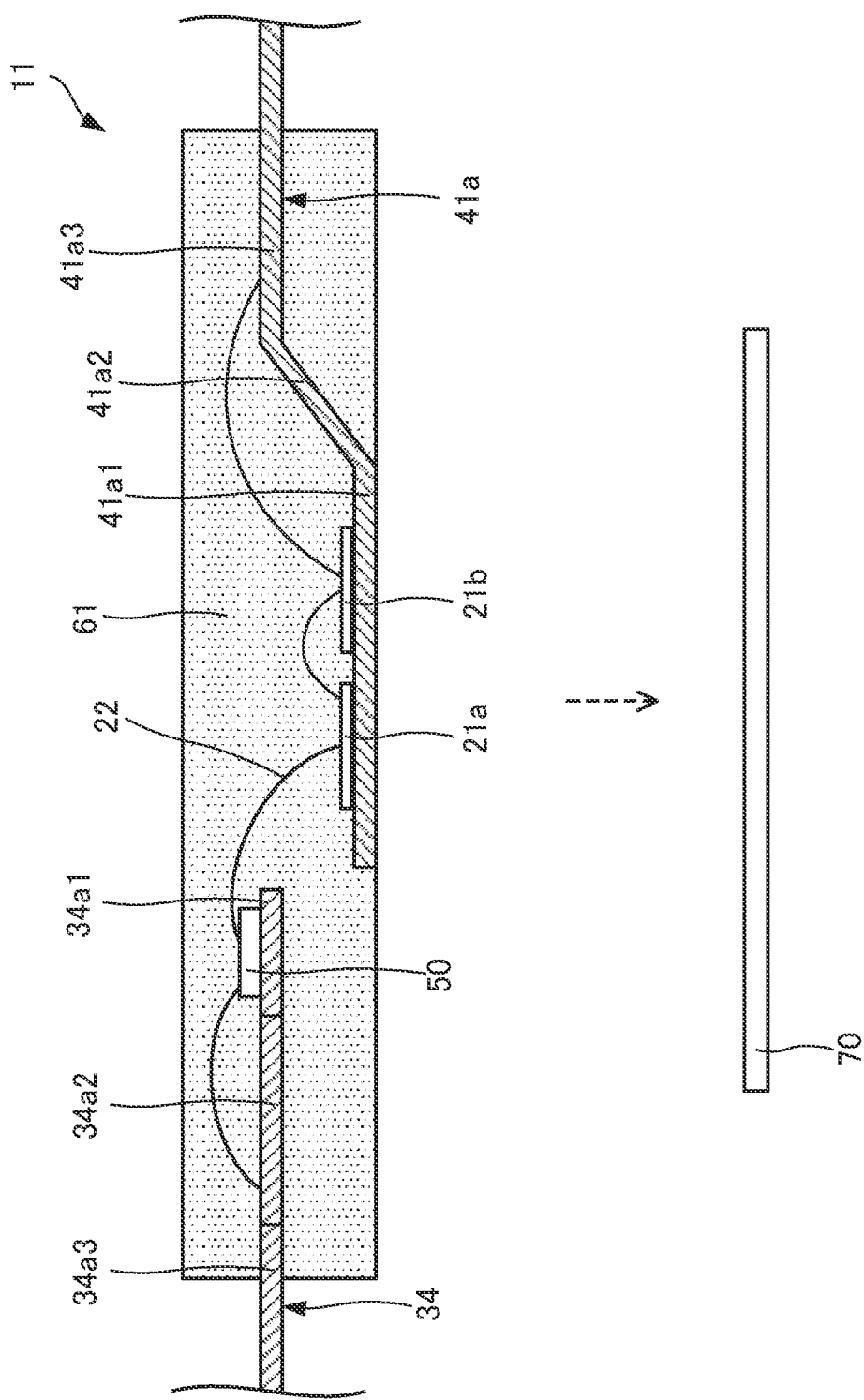
FIG. 8 illustrates the pressure-bonding of an insulating sheet to the semi-cured unit in the semiconductor device manufacturing method according to the first embodiment.

A method of manufacturing the above semiconductor device 10 will be described with reference to FIG. 4 to FIG. 8. FIG. 4 is a flowchart illustrating a semiconductor device manufacturing method according to the first embodiment. FIG. 5 illustrates a mounting step of disposing semiconductor chips and electronic parts in the semiconductor device manufacturing method according to the first embodiment. FIG. 6 illustrates an encapsulation step in the semiconductor device manufacturing method according to the first embodiment. FIG. 7 is a vertical sectional view of a semi-cured unit that is obtained after encapsulating in the semiconductor device manufacturing method according to the first embodiment. FIG. 8 illustrates the pressure-bonding of an insulating sheet to the semi-cured unit in the semiconductor device manufacturing method according to the first embodiment. In this connection, FIG. 5 to are sectional views corresponding to a sectional position along the dot-dashed line X-X of FIG. 2.

First, a preparation step of preparing the constitutional parts of the semiconductor device 10 is executed (step S1 of FIG. 4). The constitutional parts of the semiconductor device 10 include the first semiconductor chips 21a, second semiconductor chips 21b, main current lead frames 40, control lead frames 30, an insulating sheet in a semi-cured state, an encapsulation raw material, and others.

As the main current lead frames 40 and control lead frames 30, a metal plate that has a wiring pattern in which these lead frames are connected by tie bars is prepared. The main current lead frames 40 and control lead frames 30 are formed by, for example, etching or punching a single metal plate. Then, a stepped portion is formed by pressing using a mold. By doing so, the metal plate having the wiring pattern in which the main current lead frames 40 and control lead frames 30 are integrally connected by the tie bars or the like is obtained.

The insulating sheet contains a semi-cured (B stage) thermosetting resin and an inorganic filler. For example, the insulating sheet is produced as follows. First, a liquid resin (A stage) that is a thermosetting resin and an inorganic filler to be mixed with the liquid resin are prepared. The resin used here contains at least one selected from the group including epoxy resin, phenolic resin, melamine resin, and polyimide resin as a principal component. Preferably, the resin contains an epoxy resin as the principal component. In addition, as the inorganic filler, an inorganic substance containing at least one selected from the group including aluminum oxide, aluminum nitride, silicon nitride, and boron nitride as a principal component. Then, the liquid (A stage) thermosetting resin and inorganic filler are mixed, and the mixture is spread to form a sheet. The sheet is heated until it is semi-cured (B stage), thereby producing the insulating sheet.

Alternatively, the liquid (A stage) thermosetting resin mixed with the inorganic filler may be heated until it is semi-cured (B stage) and is then formed into a sheet, thereby producing the insulating sheet. In this connection, the heating and warming times may appropriately be set according to takt time and depends on the type of catalyst of the resin. For example, the heating temperature ranges from 100° C. to 200° C., inclusive.

The encapsulation raw material is a powder or tablets of a semi-cured (B stage) thermosetting resin and an inorganic filler. For example, the encapsulation raw material is made as follows. First, a liquid resin (A stage) that is a thermosetting resin and an inorganic filler to be mixed with the liquid resin are prepared. The resin used here contains, as a principal component, at least one selected from the group including epoxy resin, phenolic resin, and melamine resin. Preferably, the resin contains an epoxy resin as the principal component. In addition, as the inorganic filler, an inorganic substance containing silicon oxide as a principal component is used. Then, the inorganic filler is mixed into the liquid resin. The liquid resin (A stage) mixed with the inorganic filler is heated to thereby make the semi-cured raw material (B stage). In this connection, the heating and warming times are appropriately set according to takt time and depends on the type of catalyst of the resin. For example, the heating temperature ranges from 100° C. to 200° C., inclusive. For example, the semi-cured raw material in a semi-cured state is powdered and then is formed into tablets, thereby making the encapsulation raw material.

Then, the mounting step of disposing the semiconductor chips 21a and 21b and control ICs 50 on the main current lead frames 40 and control lead frames 30 of the metal plate and performing wiring is executed (step S2 in FIG. 4). Here, as illustrated in FIG. 5, first, the first and second semiconductor chips 21a and 21b are soldered to the die pad parts of the corresponding main current lead frames 40, and the control ICs 50 are soldered to the control die pad parts of the corresponding control lead frames 30. For example, the first and second semiconductor chips 21a and 21b are soldered to the front surface of the die pad part 41a1 of the main current lead frame 41a. In addition, the control IC 50 is soldered to the control die pad part 34a1 of the control lead frame 34. Then, these are conveyed to a prescribed bonding device, which performs wire bonding, and wiring is performed there. For example, the wiring is performed so that the main current lead frames 40 on which the first and second semiconductor chips 21a and 21b are disposed and the control lead frames 30 on which the control ICs 50 are disposed are electrically connected by bonding wires 22 as appropriate.

Then, the encapsulation step of forming the semi-cured unit 11 is executed (step S3 in FIG. 4). The semi-cured unit 11 is formed in such a way that the control die pad parts and control wiring parts of the control lead frames 30, the linking parts of the main current lead frames 40, the first and second semiconductor chips 21a and 21b are encapsulated with the encapsulation raw material in a semi-cured state, with the terminal parts of the main current lead frames 40 and the control terminal parts of the control lead frames 30 projecting and the rear surfaces of the die pad parts of the main current lead frames 40 exposed.

In the encapsulation step (step S3 in FIG. 4), first, as illustrated in FIG. 6, the main current lead frames 40 and control lead frames 30 on which the first and second semiconductor chips 21a and 21b and the control ICs 50 are disposed are placed in a mold 80. Here, first, the above main current lead frames and control lead frames 30 are conveyed to an encapsulation device for encapsulating, and are placed in a lower mold 82 of the encapsulation device. Then, the main current lead frames 40 and control lead frames 30 are sandwiched by the upper mold 81 and the lower mold 82 of the mold 80 in the encapsulation device. At this time, a passage 83 and a cavity 84 are formed in the mold 80. In this way, the plurality of main current lead frames 40 (main current lead frame 41a in FIG. 6) and the plurality of control lead frames 30 (control lead frame 34 in FIG. 6) are placed in the cavity 84 formed by the upper mold 81 and the lower mold 82.

Then, as illustrated in FIGS. 6 and 7, the cavity 84 formed in the mold 80 is filled with the encapsulation raw material, thereby forming the semi-cured unit 11. First, as illustrated in FIG. 6, the front surface of the die pad part 41a1 is pressed against the lower mold 82 using pressing pins 85a and 85b so that the rear surfaces of the die pad parts (die pad part 41a1 in FIG. 6) of the main current lead frames 40 get into contact with the front surface of the lower mold 82, and this state is held. In this connection, the pressing pins 85a and 85b are provided in the upper mold 81 of the mold 80, and are able to press the front surface of the die pad part 41a1 perpendicularly to the front surface of the lower mold 82. The pressing pins 85a and 85b may press regions where the first and second semiconductor chips 21a and 21b are not disposed on the die pad parts (die pad part 41a1 in FIG. 6) of the main current lead frames 40 placed in the mold 80.

Then, the tablets of the encapsulation raw material in the semi-cured state (B stage) are placed in a pot of the encapsulation device and are heated to be soft. The soft semi-cured encapsulation raw material is pressurized to be inserted from the passage 83 into the cavity 84. The upper mold 81 and lower mold 82 are heated in advance, and the soft semi-cured encapsulation raw material is inserted into the cavity 84. When the cavity 84 has been filled with the semi-cured encapsulation raw material, the pressing pins 85a and 85b are moved upward from the mold 80 to release the pressure against the die pad parts (die pad part 41a1 in FIG. 6). During this time as well, the semi-cured encapsulation raw material is pressurized and inserted from the passage 83, so that the portions where the pressing pins 85a and 85b have been placed are also filled with the semi-cured encapsulation raw material.

Then, the filling with the semi-cured encapsulation raw material from the passage 83 is stopped and the mold 80 is removed to take the semi-cured unit 11 out of the mold 80. As a result, as illustrated in FIG. 7, the semi-cured unit 11 is formed, in which the first and second semiconductor chips 21a and 21b, main current lead frames 40, and control lead frames 30 and others are encapsulated with the encapsulation member in the semi-cured state (semi-cured resin 61). At this time, although not illustrated in FIG. 7, the rear surfaces of the die pad parts (die pad part 41a1 in FIG. 7) of the main current lead frames 40 are exposed on the rear surface of the semi-cured unit 11 such as to be flush with the rear surface of the semi-cured unit 11. In addition, since the pressing pins 85a and 85b are pulled out upwardly, concaves are formed at positions where the pressing pins 85a and 85b have been placed in the front surface of the semi-cured resin 61. In this connection, convexes may be formed at the positions where the pressing pins 85a and 85b have been placed in the front surface of the semi-cured resin 61.

Then, the pressure-bonding step of pressure-bonding the insulating sheet 70 in the semi-cured state to the semi-cured unit 11 is executed (step S4 in FIG. 4). First, as illustrated in FIG. 8, the insulating sheet 70 in the semi-cured state and semi-cured unit 11 are conveyed to a pressure-bonding device. Then, the insulating sheet 70 in the semi-cured state is placed so that the front surface thereof covers the die pad parts exposed on the rear surface of the semi-cured unit 11, and is pressure-bonded by the pressure-bonding device. As the pressure-bonding device, a press device may be used. In this case, the heating may be performed during the pressure-bonding. As such a pressure-bonding device, a heat press device may be used. By heating the insulating sheet 70 in the semi-cured state to be soft and then pressure-bonding the soft insulating sheet 70 in the semi-cured state, it becomes possible that the insulating sheet 70 adheres to the semi-cured unit 11. Then, the semi-cured unit 11 to which the insulating sheet 70 in the semi-cured state is pressure-bonded is taken out of the pressure-bonding device, so that the semi-cured unit 11 to which the insulating sheet 70 in the semi-cured state is pressure-bonded is obtained.

Then, a curing step is executed (step S5 in FIG. 4). First, the semi-cured unit 11 to which the insulating sheet 70 in the semi-cured state is pressure-bonded is conveyed to a heating device. Then, in the heating device, the semi-cured unit 11 to which the insulating sheet 70 in the semi-cured state is pressure-bonded is heated at a prescribed temperature. At this time, the heating temperature is in a range from 120° C. to 180° C., inclusive. In this connection, during the heating, the semi-cured unit 11 to which the insulating sheet 70 in the semi-cured state is pressure-bonded is in a no-pressure atmosphere in which no pressure is applied. In this way, the insulating sheet 70 in the semi-cured state and the semi-cured unit 11 are cured. As a result, the semiconductor device 10 including the cured encapsulation member 60 and insulating sheet 70 as illustrated in FIG. 3 is manufactured. In this connection, unneeded members including the tie bars and others may be removed from the metal plate, before or after the curing process (step S5 of FIG. 4). In addition, a bending process may be performed on the terminal parts of the main current lead frames 40 and the control terminal parts of the control lead frames 30.

By pressure-bonding the insulating sheet 70 in the semi-cured state to the rear surface of the semi-cured unit 11 and curing them, the encapsulation member 60 and insulating sheet 70 in the semi-cured state are cured together from the semi-cured state. This enables them to be joined to each other firmly. In addition, in the case where resins containing the same principal component are used for the encapsulation member 60 and for the insulating sheet in the semi-cured state, they are joined to each other more firmly. Preferably, thermosetting resins used for the encapsulation member 60 and for the insulating sheet 70 both contain an epoxy resin as their principal components. In addition, after the insulating sheet 70 in the semi-cured state is pressure-bonded to the rear surface of the semi-cured unit 11 in this way, they are cured altogether by such a different device. This makes it possible to manufacture the semiconductor device 10 with the insulating sheet 70 easily with preventing an increase in the manufacturing cost.

Figure 9:
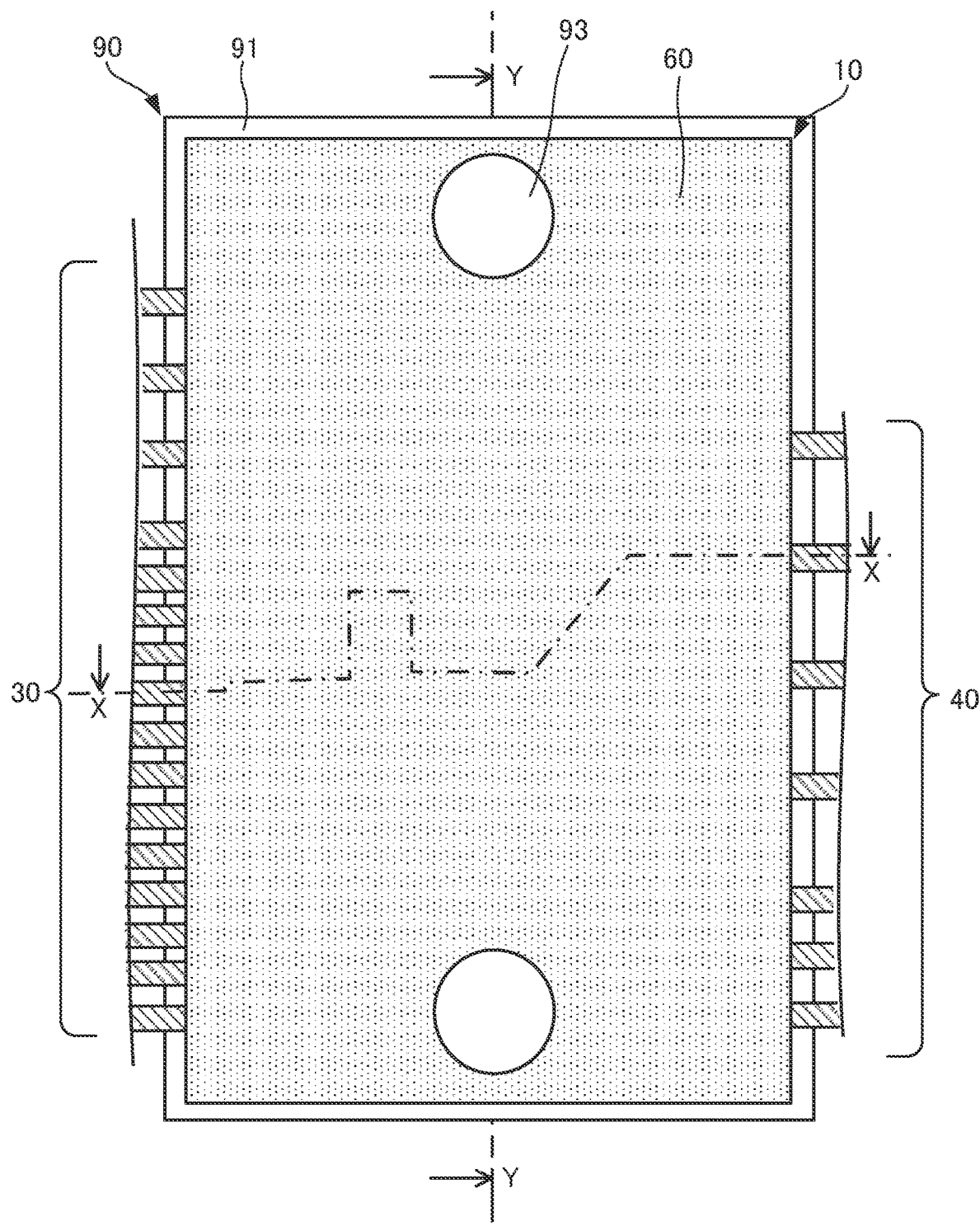
FIG. 9 is a plan view of the semiconductor device having a heatsink attached thereto according to the first embodiment.
Figure 10:
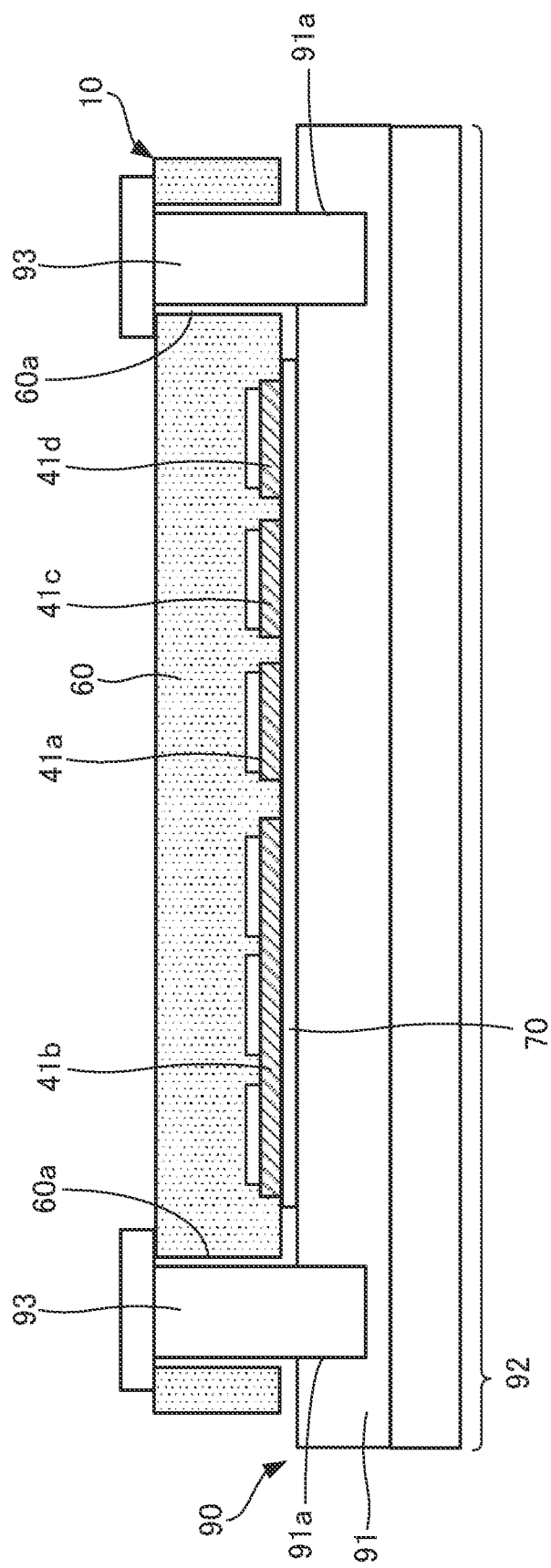
FIG. 10 is a first vertical sectional view of the semiconductor device having the heatsink attached thereto according to the first embodiment.
Figure 11:
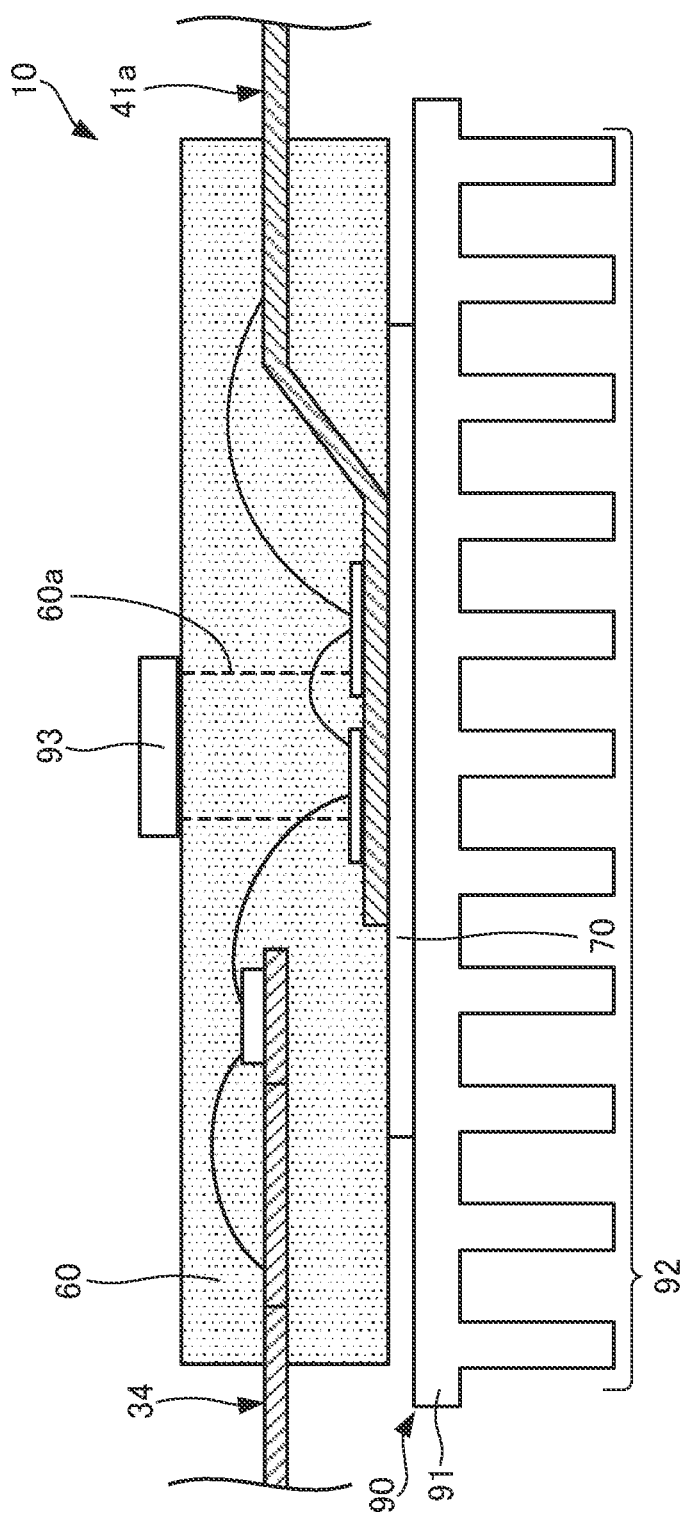
FIG. 11 is a second vertical sectional view of the semiconductor device having the heatsink attached thereto according to the first embodiment.

The following describes the case of attaching a heatsink, as an example of a cooling unit, to the semiconductor device 10, with reference to FIGS. 9 to 11. FIG. 9 is a plan view of the semiconductor device having a heatsink attached thereto according to the first embodiment. FIGS. 10 and 11 are vertical sectional views of the semiconductor device having the heatsink attached thereto according to the first embodiment. In this connection, FIG. 10 is a sectional view along the dot-dashed line X-X of FIG. 9, and FIG. 11 is a sectional view along the dot-dashed line Y-Y of FIG. 9. The dot-dashed line X-X of FIG. 9 corresponds to the dot-dashed line X-X of FIG. 2. In this connection, reference numerals of some parts are omitted in FIGS. 10 and 11.

A heatsink 90 is attached to the rear surface of the semiconductor device 10 with bolts 93. The heatsink 90 is an example of a cooling unit and is made of metal with high thermal conductivity. Examples of this metal include aluminum, iron, silver, copper, and an alloy containing at least one of these. The heatsink 90 includes a heat dissipating plate 91 and a fin unit 92 with one or more fins formed on the rear surface of the heat dissipating plate 91. In addition, the heat dissipating plate 91 is rectangular and is larger in size than the semiconductor device 10 in plan view, and bolt holes 91a into which the bolts 93 are inserted are formed in the front surface of the heat dissipating plate 91. These bolt holes 91a are aligned with the mounting holes 60a of the semiconductor device 10 when the heatsink 90 is attached to the rear surface of the semiconductor device 10. To improve the corrosion resistance, plating using nickel or another material may be performed on the front surface of the heatsink 90, for example. Examples of this material include, other than nickel, a nickel-phosphorus alloy, a nickel-boron alloy, and others. A cooling device employing water cooling may be used as another example of the cooling unit. In this case, the cooling device is provided with bolt holes that are aligned with the mounting holes 60a of the semiconductor device 10.

The rear surface of the semiconductor device 10 is placed on the front surface of the heatsink 90 (heat dissipating plate 91), the bolts 93 are inserted from the mounting holes 60a into the bolt holes 91a of the heat dissipating plate 91 of the heatsink 90. By doing so, the heatsink 90 is attached to the semiconductor device 10. Since the insulating sheet 70 is attached to the encapsulation member 60 with a level difference therebetween in the semiconductor device 10, only the insulating sheet 70 is in contact with the front surface of the heat dissipating plate 91 of the heatsink 90. Therefore, the fastening force of the bolts 93 becomes a contact force between the heatsink 90 and the insulating sheet 70, and this makes it possible to improve the heat dissipation property of the semiconductor device 10. In this connection, in this case, a thermal compound is applied between the insulating sheet 70 and the heatsink 90. An increase in the contact force between the heatsink 90 and the insulating sheet 70 allows the thermal compound to spread thinly, entirely, and evenly between the insulating sheet 70 and the heatsink 90.

In the above-described semiconductor device 10, the first and second semiconductor chips 21a and 21b are disposed on the front surface of the die pad part 41a1 of the main current lead frame 41a and wiring is performed. Then, an encapsulation raw material in a semi-cured state is used to encapsulate the main current lead frame 41a and first and second semiconductor chips 21a and 21b with the terminal part 41a3 of the main current lead frame 41a projecting and the rear surface of the die pad part 41a1 exposed, so that the semi-cured unit 11 is formed. Then, the front surface of the insulating sheet 70 is pressure-bonded to the rear surface of the semi-cured unit 11 to cover the rear surface of the die pad part 41a1 of the main current lead frame 41a. The above manufacturing method makes it possible to attach the insulating sheet 70 without corrugation, regardless of the specifications of the mold 80. The manufacturing method does not need a conveyance mechanism for conveying the insulating sheet 70 to the mold 80, and is therefore able to manufacture the semiconductor device 10 including the insulating sheet 70 easily and without fail with minimizing the manufacturing cost.

The encapsulation member 60 and insulating sheet 70 of thus manufactured semiconductor device 10 each contain a thermosetting resin and an inorganic filler. Preferably, the thermosetting resins for the encapsulation member 60 and for the insulating sheet 70 both contain the same thermosetting resin as their principal components. More preferably, the thermosetting resins for the encapsulation member 60 and for the insulating sheet 70 both contain an epoxy resin as their principal components.

In addition, in thus manufactured semiconductor device 10, the insulating sheet 70 is attached to the rear surface of the encapsulation member 60 with a level difference therebetween. Therefore, when the heatsink 90 is attached to the rear surface of the semiconductor device 10, the heatsink 90 is in contact with the insulating sheet 70 only. Therefore, the fastening force of the bolts 93 becomes a contact force between the heatsink 90 and the insulating sheet 70 and by the contact force the thermal compound spreads thinly and entirely between the heatsink 90 and the insulating sheet 70, which makes it possible to improve the heat dissipation property of the semiconductor device 10.

Second Embodiment

Figure 12:
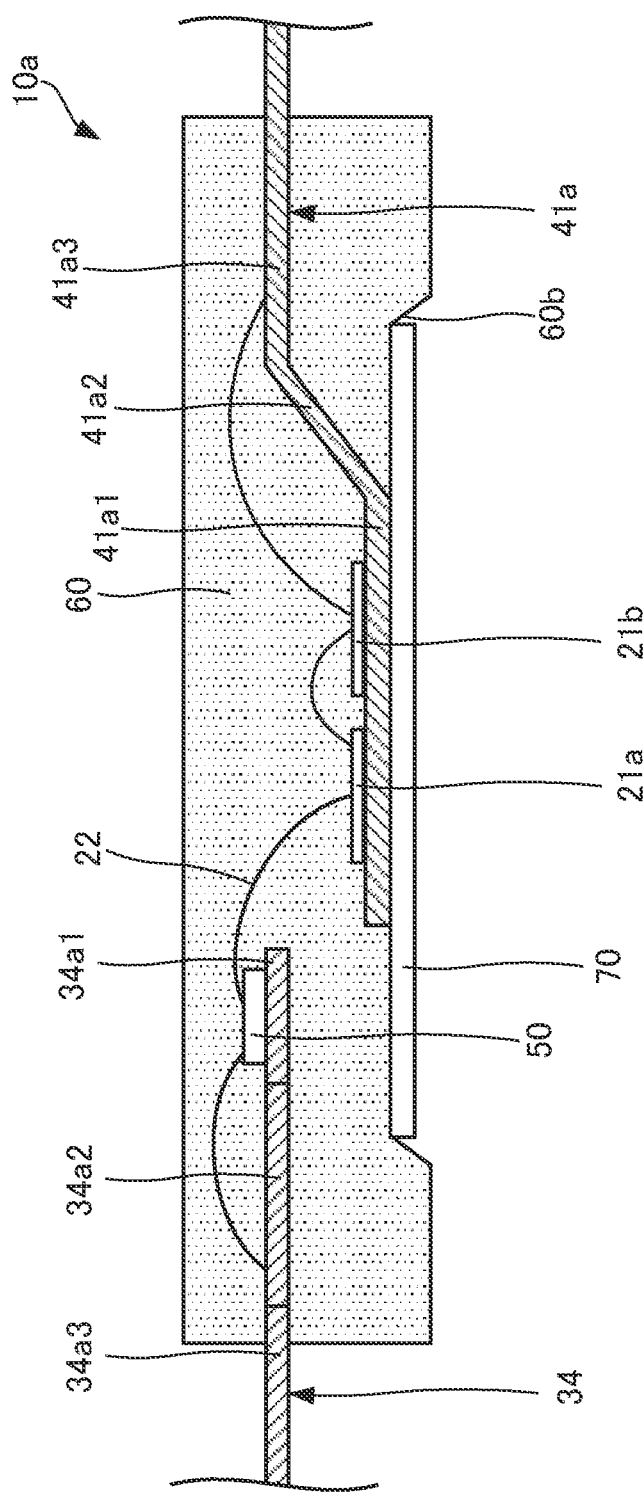
FIG. 12 is a vertical sectional view of a semiconductor device according to a second embodiment.

A semiconductor device according to a second embodiment will be described with reference to FIG. 12. FIG. 12 is a vertical sectional view of a semiconductor device according to a second embodiment. In this connection, in the semiconductor device 10a, parts equivalent to those in the semiconductor device 10 are designated by the same reference numerals as used in the semiconductor device 10, and their explanation will be omitted or simplified. In the semiconductor device 10a, a recess 60b is formed in the rear surface of an encapsulation member 60. The rear surfaces of the die pad parts (die pad part 41a1 in FIG. 12) of main current lead frames 40 are exposed within the recess 60b. Therefore, the rear surface of the encapsulation member 60 around the recess 60b is positioned at a lower level than the rear surface of the die pad part 41a1. In this connection, for manufacturing the above semiconductor device 10a, a mold having a protrusion for forming the recess 60b in the encapsulation member 60 is used. The other manufacturing steps are the same as those in the first embodiment.

Figure 13:
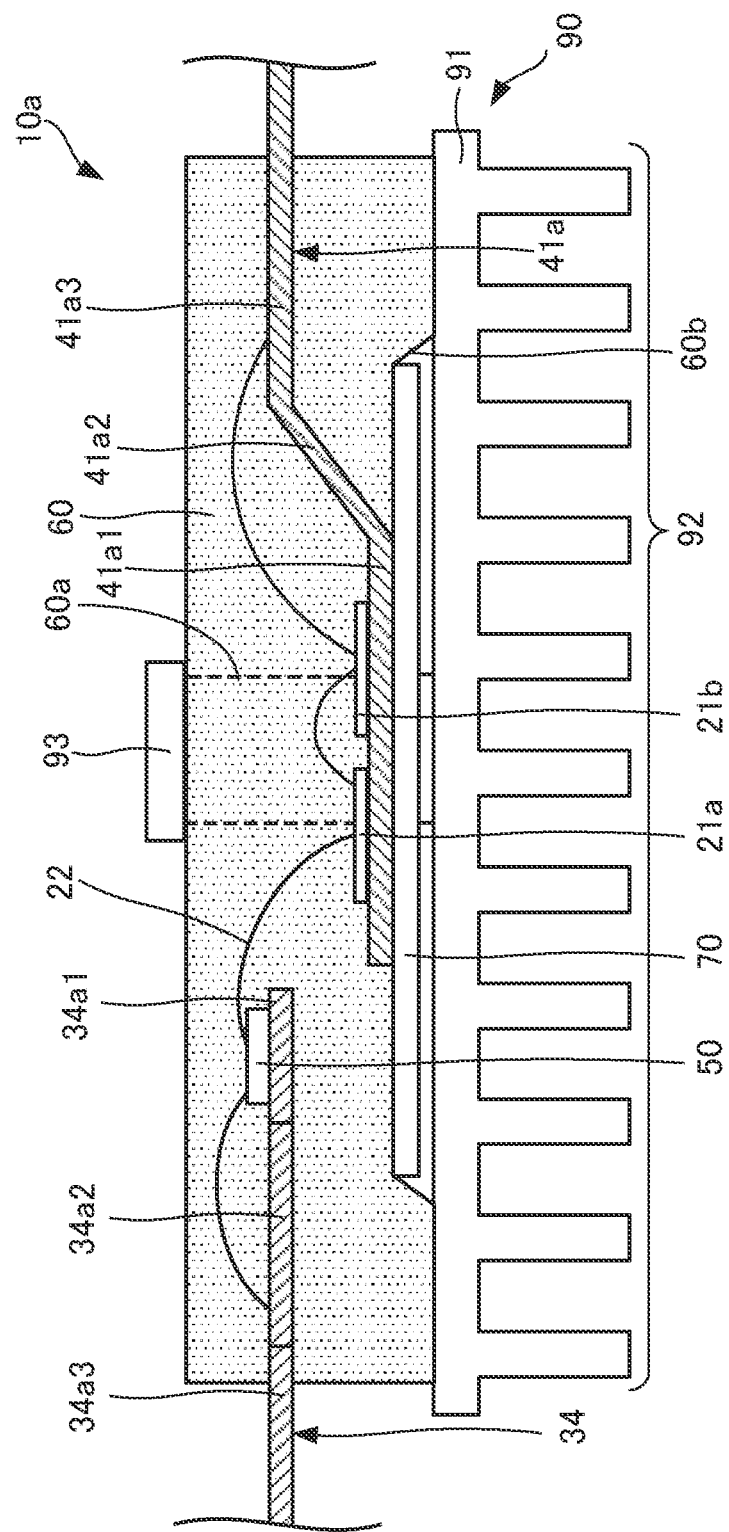
FIG. 13 is a vertical sectional view of the semiconductor device and a heatsink according to the second embodiment.

The following describes the case of attaching a heatsink 90 to the above semiconductor device 10a with reference to FIG. 13. FIG. 13 is a vertical sectional view of the semiconductor device and the heatsink according to the second embodiment. In this connection, FIG. 13 corresponds to the cross section illustrated in FIG. 11. Before attaching the heatsink 90 to the semiconductor device 10a, a thermal compound is applied inside the recess 60b of the semiconductor device 10a. Then, as in the first embodiment, the heatsink 90 is attached to the rear surface of the semiconductor device 10a, and bolts 93 are fastened. When the bolts 93 are fastened, the rear surface of the semiconductor device 10a and the front surface of the heatsink 90 get into contact with each other, which enables the thermal compound to have an even thickness between the rear surface of the insulating sheet 70 and the front surface of the heatsink 90. This leads to an improvement in the thermal conductivity from the insulating sheet 70 to the heatsink 90. To improve the thermal conductivity, it is desired that the thermal compound be spread thinly and evenly. Therefore, the depth of the recess 60b is preferably set so that the rear surface of the insulating sheet 70 is at the same level in height as the rear surface of the semiconductor device 10a around the recess 60b or at a level difference in height therefrom by distance ranging from 10 μm to 100 μm, inclusive.

Third Embodiment

Figure 14:
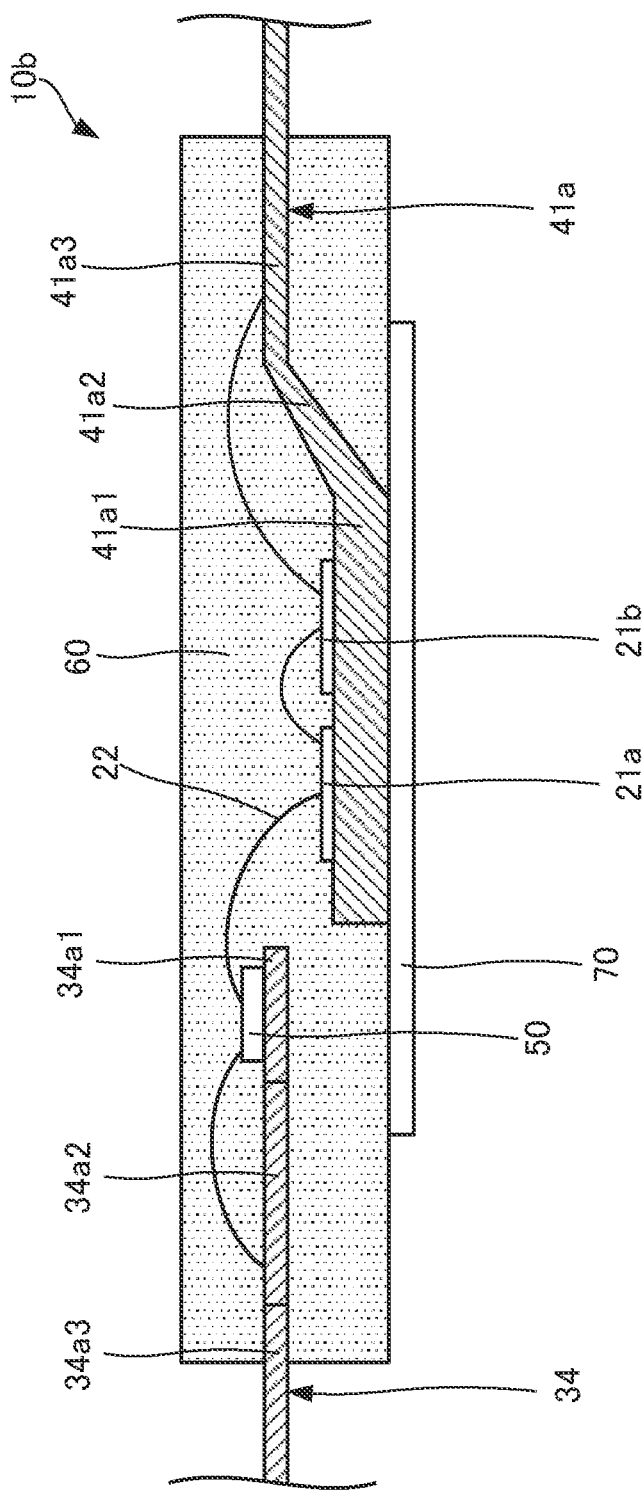
FIG. 14 is a vertical sectional view of a semiconductor device according to a third embodiment.

A semiconductor device according to a third embodiment will be described with reference to FIG. 14. FIG. 14 is a vertical sectional view of the semiconductor device according to the third embodiment. In this connection, in the semiconductor device 10b, parts equivalent to those in the semiconductor device are designated by the same reference numerals as used in the semiconductor device 10, and their explanation will be omitted or simplified. In the semiconductor device 10b, the die pad parts (die pad part 41a1 in FIG. 14) of main current lead frames 40 are made thicker than those in the first embodiment. Therefore, the die pad part 41a1 is thicker than a linking part 41a2 and a terminal part 41a3. This increases the heat capacity of the main current lead frames 40 and makes it possible to prevent an excessive increase in thermal resistance. In addition, since the die pad parts (die pad part 41a1 in FIG. 14) are made thicker, a heat diffusion occurs and the heat resistance is reduced as compared with the first embodiment. Therefore, it is possible to improve the heat dissipation property of the semiconductor device 10b as compared with the semiconductor device 10. In addition, the third embodiment is not limited to the case illustrated in FIG. 14. For example, the die pad parts of the main current lead frames 40 illustrated in the second embodiment may be made thicker than in the second embodiment.

The disclosed techniques make it possible to prevent a decrease in heat dissipation property and a reduction in the reliability of a semiconductor device with preventing an increase in the manufacturing cost.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, the method comprising:
    a preparation step of preparing a power semiconductor chip, a lead frame, and an insulating sheet in a semi-cured state, the lead frame having a die pad part and a terminal part integrally connected to the die pad part;
    a mounting step of disposing the power semiconductor chip on a front surface of the die pad part and performing wiring;
    an encapsulation step of encapsulating the lead frame and the power semiconductor chip with an encapsulation raw material in a semi-cured state, to thereby form a semi-cured unit, the terminal part projecting from the semi-cured unit, and a rear surface of the die pad part being exposed from a rear surface of the semi-cured unit;
    a pressure-bonding step of pressure-bonding a front surface of the insulating sheet to the rear surface of the semi-cured unit to cover the rear surface of the die pad part; and
    a curing step of curing the semi-cured unit and the insulating sheet by heating.

2. The method of manufacturing a semiconductor device according to claim 1, wherein, after the pressure-bonding step is executed, the semi-cured unit having the insulating sheet pressure-bonded thereto is conveyed to a heating device, and the curing step is executed by the heating device.

3. The method of manufacturing a semiconductor device according to claim 1, wherein
    the pressure-bonding step further includes
        heating the insulating sheet, and
            pressing the semi-cured unit against the heated insulating sheet.

4. The method of manufacturing a semiconductor device according to claim 1, wherein the curing step includes heating the semi-cured unit having the insulating sheet pressure-bonded thereto in a non-pressure atmosphere.

5. The method of manufacturing a semiconductor device according to claim 1, wherein the encapsulation raw material and the insulating sheet each contain a thermosetting resin in a semi-cured state and an inorganic filler.

6. The method of manufacturing a semiconductor device according to claim 5, wherein
    the inorganic filler for the encapsulation raw material contains silicon oxide as a principal component, and
    the inorganic filler for the insulating sheet contains at least one selected from a group including aluminum oxide, aluminum nitride, silicon nitride, and boron nitride, as a principal component.

7. The method of manufacturing a semiconductor device according to claim 1, wherein the thermosetting resin for the encapsulation raw material and the thermosetting resin for the insulating sheet each contain an epoxy resin.

8. A semiconductor device, comprising:
    a lead frame having a die pad part and a terminal part integrally connected to the die pad part;
    a power semiconductor chip disposed on a front surface of the die pad part;
    an encapsulation member encapsulating the lead frame and the power semiconductor chip, the terminal part projecting from the encapsulation member, and a rear surface of the die pad part being exposed from a rear surface of the encapsulation member;
    an insulating sheet provided to cover the rear surface of the die pad part, the insulating sheet forming a level difference from the rear surface of the encapsulation member, the insulating sheet being larger in size than the die pad part in a plan view of the semiconductor device, wherein
        the rear surface of the encapsulation member has a recessed portion,
        the rear surface of the die pad part is exposed from the rear surface of the encapsulation member in the recessed portion,
        the rear surface of the die pad part and the rear surface of the encapsulation member in the recessed portion are covered by the insulating sheet, and
        the recessed portion has a thermal compound applied therein; and
    a heatsink attached to the thermal compound in the recced portion and the rear surface of the encapsulation member outside the recessed portion.

9. The semiconductor device according to claim 8, wherein the encapsulation member and the insulating sheet each contain a thermosetting resin and an inorganic filler.

10. The semiconductor device according to claim 9, wherein the thermosetting resin for the encapsulation member and the thermosetting resin for the insulating sheet each contain an epoxy resin as a principal component.

11. The semiconductor device according to claim 9, wherein
the inorganic filler for the encapsulation member contains silicon oxide as a principal component, and
the inorganic filler for the insulating sheet contains at least one selected from a group including aluminum oxide, aluminum nitride, silicon nitride, and boron nitride, as a principal component.

12. The semiconductor device according to claim 8, wherein the rear surface of the die pad part is flush with the rear surface of the encapsulation member in the recessed portion.

13. The semiconductor device according to claim 8, wherein the rear surface of the encapsulation member other than the recess portion is flush with a rear surface of the insulating sheet, or is higher than the rear surface of the insulating sheet in a direction from the die pad part to the insulating sheet perpendicular to the back surface of the die pad part.

14. The semiconductor device according to claim 8, wherein the die pad part is thicker than the terminal part.

* * * * *